United States Patent
Choi

(10) Patent No.: US 10,636,817 B2
(45) Date of Patent: Apr. 28, 2020

(54) ARRAY SUBSTRATE AND FABRICATING METHOD THEREOF

(71) Applicant: BOE TECHNOLOGY GROUP CO., LTD., Beijing (CN)

(72) Inventor: Seungjin Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/550,640

(22) PCT Filed: Feb. 28, 2017

(86) PCT No.: PCT/CN2017/075163
§ 371 (c)(1),
(2) Date: Aug. 11, 2017

(87) PCT Pub. No.: WO2018/014559
PCT Pub. Date: Jan. 25, 2018

(65) Prior Publication Data
US 2018/0233519 A1     Aug. 16, 2018

(30) Foreign Application Priority Data

Jul. 18, 2016 (CN) .......................... 2016 1 0566052

(51) Int. Cl.
H01L 27/12  (2006.01)
H01L 21/77  (2017.01)
H01L 29/786 (2006.01)

(52) U.S. Cl.
CPC .......... *H01L 27/1225* (2013.01); *H01L 21/77* (2013.01); *H01L 27/127* (2013.01); *H01L 27/1222* (2013.01); *H01L 29/7869* (2013.01)

(58) Field of Classification Search
None
See application file for complete search history.

(56) References Cited

U.S. PATENT DOCUMENTS

2011/0008930 A1*  1/2011  Sasaki ................. H01L 29/7869
                                                          438/104
2011/0212570 A1   9/2011  Yamazaki et al.
(Continued)

FOREIGN PATENT DOCUMENTS

CN    102473362 A    5/2012
CN    102782859 A    11/2012
(Continued)

OTHER PUBLICATIONS

International Search Report & Written Opinion dated Jun. 6, 2017, regarding PCT/CN2017/075163.
(Continued)

*Primary Examiner* — Walter H Swanson
*Assistant Examiner* — Kien C Ly
(74) *Attorney, Agent, or Firm* — Intellectual Valley Law, P.C.

(57) ABSTRACT

The present application discloses an array substrate having a display area and a peripheral area. The array substrate includes a plurality of first thin film transistors respectively in a plurality of subpixels in the display area; and a plurality of second thin film transistors in the peripheral area, an oxygen content in active layers of the plurality of first thin film transistors being higher than that in active layers of the plurality of second thin film transistors.

19 Claims, 6 Drawing Sheets

(56) References Cited

U.S. PATENT DOCUMENTS

| | | |
|---|---|---|
| 2011/0284848 A1 | 11/2011 | Yamazaki |
| 2012/0108018 A1 | 5/2012 | Okabe et al. |
| 2015/0214374 A1* | 7/2015 | Hara .................. H01L 27/1248 257/43 |
| 2016/0027817 A1 | 1/2016 | Yoo et al. |
| 2016/0027818 A1 | 1/2016 | Yoo et al. |
| 2016/0049517 A1* | 2/2016 | Lee .................. H01L 29/78696 257/43 |
| 2016/0126242 A1* | 5/2016 | Ellinger ............. H01L 27/0883 257/43 |
| 2017/0110584 A1 | 4/2017 | Yan |

FOREIGN PATENT DOCUMENTS

| | | |
|---|---|---|
| CN | 103700628 A | 4/2014 |
| CN | 103715094 A | 4/2014 |
| CN | 104916546 A | 9/2015 |
| CN | 105448824 A | 3/2016 |

OTHER PUBLICATIONS

Decision of Rejection in the Chinese Patent Application No. 201610566052.4, dated Sep. 3, 2019; English translation attached.

\* cited by examiner

US 10,636,817 B2

ARRAY SUBSTRATE AND FABRICATING METHOD THEREOF

CROSS-REFERENCE TO RELATED APPLICATION

This application is a national stage application under 35 U.S.C. § 371 of International Application No. PCT/CN2017/075163 filed Feb. 28, 2017, which claims priority to Chinese Patent Application No. 201610566052.4, filed Jul. 18, 2016, the contents of which are incorporated by reference in the entirety.

TECHNICAL FIELD

The present invention relates to display technology, more particularly, to an array substrate, a method of fabricating an array substrate, a display panel and a display apparatus having an array substrate.

BACKGROUND

Gate-on-array is a process technology that integrates a gate driving circuit on the array substrate. An array substrate includes a display area and a peripheral area. Typically, the gate-on-array units are disposed in the peripheral area. The gate-on-array units may include a plurality of thin film transistors. The display area includes a plurality of subpixels, each of which also includes one or more thin film transistors. The thin film transistors in the display area and the peripheral area may be formed in a single patterning process, thereby saving cost and increasing efficiency.

SUMMARY

In one aspect, the present invention provides an array substrate having a display area and a peripheral area, comprising a plurality of first thin film transistors respectively in a plurality of subpixels in the display area; and a plurality of second thin film transistors in the peripheral area; wherein an oxygen content in active layers of the plurality of first thin film transistors is higher than that in active layers of the plurality of second thin film transistors.

Optionally, initial threshold voltages of the plurality of first thin film transistors are more positive or less negative than initial threshold voltages of the plurality of second thin film transistors.

Optionally, the active layers of the plurality of first thin film transistors and the active layers of the plurality of second thin film transistors comprise $M1O_aN_b$, wherein M1 is a single metal or a combination of metals, a>0, and b≥0.

Optionally, the active layers of the plurality of first thin film transistors and the active layers of the plurality of second thin film transistors comprise indium gallium zinc oxide.

Optionally, the plurality of first thin film transistors and the plurality of second thin film transistors are bottom gate-type thin film transistors; each of the plurality of first thin film transistors comprises a gate electrode on a side of each of the active layers of the plurality of first thin film transistors proximal to the base substrate; and each of the plurality of second thin film transistors comprises a gate electrode on a side of each of the active layers of the plurality of second thin film transistors proximal to the base substrate.

Optionally, channel regions, source electrode contact regions, and drain electrode contact regions of the active layers of the plurality of first thin film transistors have substantially a same oxygen content; and channel regions, source electrode contact regions, and drain electrode contact regions of the active layers of the plurality of second thin film transistors have substantially a same oxygen content.

Optionally, the plurality of second thin film transistors are in one or more gate-on-array circuits.

Optionally, a ratio of the oxygen content in active layers of the plurality of first thin film transistors to that in active layers of the plurality of second thin film transistors is in a range of approximately 1.005 to approximately 1.2.

In another aspect, the present invention provides a method of fabricating an array substrate having a display area and a peripheral area, comprising forming a plurality of first thin film transistors respectively in a plurality of subpixels in the display area and a plurality of second thin film transistors in the peripheral area; wherein the plurality of first thin film transistors are formed to have a higher oxygen content in active layers of the plurality of first thin film transistors than that in active layers of the plurality of second thin film transistors.

Optionally, the method comprising forming a semiconductor material layer on a base substrate; patterning the semiconductor material layer to form a plurality of first semiconductor material blocks corresponding to the active layers of the plurality of first thin film transistors and a plurality of second semiconductor material blocks corresponding to the active layers of the plurality of second thin film transistors; and increasing an oxygen content in the plurality of first semiconductor material blocks.

Optionally, increasing the oxygen content in the plurality of first semiconductor material blocks is performed by plasma bombarding the plurality of first semiconductor material blocks with a plasma comprising oxygen.

Optionally, the plasma comprising oxygen comprises nitrous oxide or oxygen.

Optionally, the plasma bombarding is performed at a power in a range of approximately 400 w to approximately 800 w for a duration in a range of approximately 40 seconds to approximately 60 seconds.

Optionally, patterning the semiconductor material layer to form the plurality of first semiconductor material blocks and the plurality of second semiconductor material blocks are performed in a single process.

Optionally, patterning the semiconductor material layer comprises forming a first photoresist layer on a side of the semiconductor material layer distal to the base substrate; the first photoresist layer being in a first region corresponding to the active layers of the plurality of first thin film transistors and the active layers of the plurality of second thin film transistors; removing the semiconductor material layer outside the first region, thereby forming the plurality of first semiconductor material blocks and the plurality of second semiconductor material blocks; forming a second photoresist layer by removing a portion of the first photoresist layer to expose the plurality of first semiconductor material blocks, the second photoresist layer being on a side of the plurality of second semiconductor material blocks distal to the base substrate; wherein increasing the oxygen content in the plurality of first semiconductor material blocks comprises plasma bombarding the plurality of first semiconductor material blocks with a plasma comprising oxygen, thereby forming the active layers of the plurality of first thin film transistors; and subsequent to increasing the oxygen content in the plurality of first semiconductor material blocks, the method further comprising removing the second photoresist layer thereby forming the active layers of the plurality of second thin film transistors.

Optionally, patterning the semiconductor material layer comprises forming a photoresist material layer on a side of the semiconductor material layer distal to the base substrate; exposing the photoresist material layer with a mask plate, and developing an exposed photoresist material layer to obtain a photoresist pattern having a first section in a region corresponding to the active layers of the plurality of first thin film transistors and the active layers of the plurality of second thin film transistors, and a second section outside of the first region, the photoresist material being removed in the second section thereby forming a first photoresist layer in the second section; and removing the semiconductor material layer in a region corresponding to the second section, thereby forming the plurality of first semiconductor material blocks and the plurality of second semiconductor material blocks.

Optionally, the mask plate is a half-tone mask plate or a gray-tone mask plate, the first section comprises a first zone and a second zone; the first zone corresponding to the active layers of the plurality of first thin film transistors; the second zone corresponding to the active layers of the plurality of second thin film transistors; the second zone is substantially unexposed, the first zone is partially exposed, and the second section is fully exposed; and the first photoresist layer in the second zone has a thickness greater than that in the first zone; the method further comprising ashing the first photoresist layer to remove the first photoresist layer in the first zone thereby exposing the plurality of first semiconductor material blocks; wherein photoresist material in the second zone remains with a reduced thickness subsequent to ashing, thereby forming a second photoresist layer.

Optionally, prior to forming the active layers of the plurality of first thin film transistors and the active layers of the plurality of second thin film transistors, further comprising forming a gate electrode on a side of each of the active layers of the plurality of first thin film transistors and the active layers of the plurality of second thin film transistors proximal to the base substrate.

Optionally, the active layers of the plurality of first thin film transistors and the active layers of the plurality of second thin film transistors comprise $M1O_aN_b$, wherein M1 is a single metal or a combination of metals, a>0, and b≥0.

In another aspect, the present invention provides an array substrate fabricated by a method described herein.

In another aspect, the present invention provides a display apparatus comprising the array substrate described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
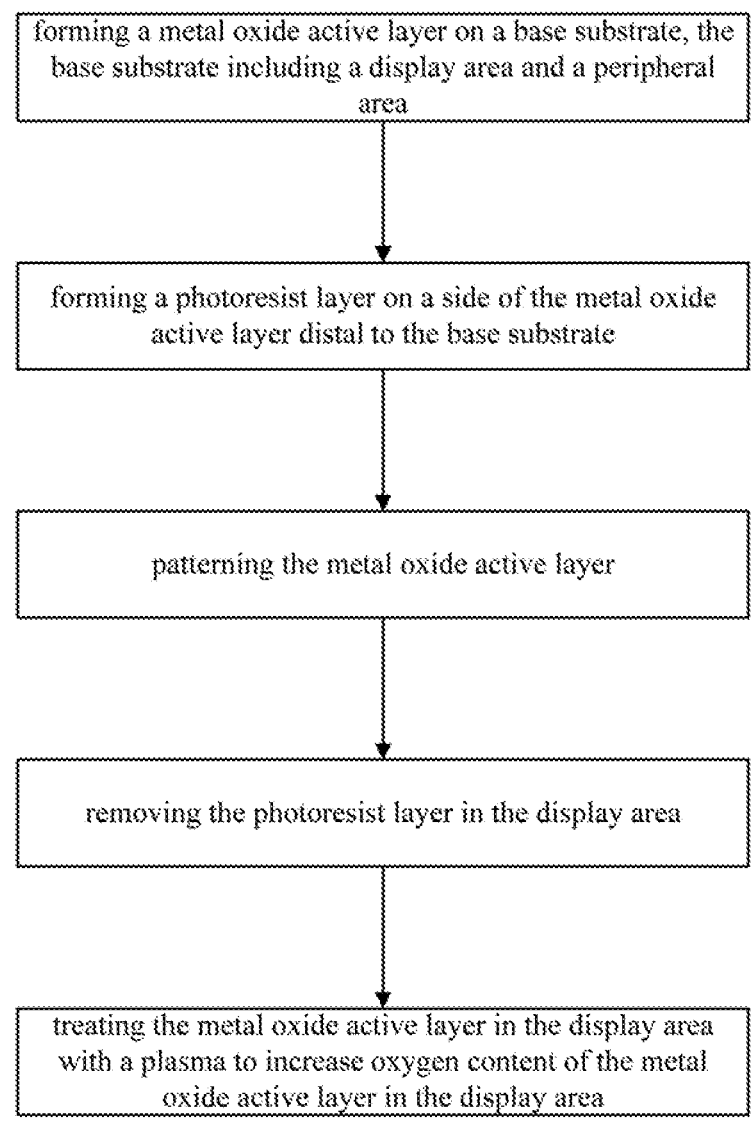
FIG. 1 is a flow chart illustrating a method of fabricating an array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In conventional array substrates and display apparatuses, the thin film transistors in the display area are subject to externally applied voltages. As the working duration increases, a large amount of carriers accumulate in the thin film transistors, and the threshold voltage of the thin film transistors undergoes a negative shift. The reliability of the thin film transistor in the display area is adversely affected.

Accordingly, the present invention provides, inter alia, an array substrate and a method of fabricating an array substrate that substantially obviate one or more of the problems due to limitations and disadvantages of the related art. In one aspect, the present disclosure provides a method of fabricating an array substrate having a display area and a peripheral area. In some embodiments, the method includes forming a plurality of first thin film transistors respectively in a plurality of subpixels in the display area and a plurality of second thin film transistors in the peripheral area; the plurality of first thin film transistors are formed to have a higher oxygen content in active layers of the plurality of first thin film transistors than that in active layers of the plurality of second thin film transistors. Specifically, in some embodiments, the method includes forming a semiconductor material layer on a base substrate; patterning the semiconductor material layer to form a plurality of first semiconductor material blocks corresponding to the active layers of the plurality of first thin film transistors and a plurality of second semiconductor material blocks corresponding to the active layers of the plurality of second thin film transistors; and increasing an oxygen content in the plurality of first semiconductor material blocks so that the active layers of the plurality of first thin film transistors have a higher oxygen content than the active layers of the plurality of second thin film transistors. Optionally, the step of increasing the oxygen content in the plurality of first semiconductor material blocks is performed by plasma bombarding the plurality of first semiconductor material blocks with a plasma containing oxygen (e.g., nitrous oxide or oxygen).

In some embodiments, the active layers of the plurality of first thin film transistors and the active layers of the plurality of second thin film transistors include $M1O_aN_b$, wherein M1 is a single metal or a combination of metals, a>0, and b≥0, e.g., the active layer of the plurality of first thin film transistors and the active layers of the plurality of second thin film transistors are made of a metal oxide material or a metal oxynitride material. Examples of appropriate metal oxide active layer materials include, but are not limited to, indium gallium zinc oxide, zinc oxide, gallium oxide, indium oxide, HfInZnO (HIZO), amorphous InGaZnO (amorphous IGZO), InZnO, amorphous InZnO, ZnO:F, $In_2O_3$:Sn, $In_2O_3$:Mo, $Cd_2SnO_4$, ZnO:Al, $TiO_2$:Nb, and Cd—Sn—O. Examples of appropriate metal oxynitride active layer materials include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or combination thereof. Optionally, the active layer is made of a material including $MIO_aN_b$ doped with one or more metal element. Optionally, the active layer of the plurality of first thin film transistors and the active layers of the plurality of second thin film transistors are made of a material including $MIO_aN_b$ doped with one or more non-metal element. Optionally, the active layer is made of a material including $MIO_aN_b$ doped with one or more metal element and one or more non-metal element. Optionally, the active layers of the plurality of first thin film transistors and the active layers of the plurality of second thin film transistors include indium gallium zinc oxide.

As used herein, the term "display area" refers to an area of a display substrate (e.g., an array substrate) in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of a display substrate (e.g., an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

In one example, the active layers are made of a metal oxide semiconductor material. FIG. 1 is a flow chart illustrating a method of fabricating an array substrate in some embodiments according to the present disclosure. Referring to FIG. 1, the method in some embodiments includes forming a metal oxide active layer on a base substrate, the base substrate including a display area and a peripheral area; forming a photoresist layer on a side of the metal oxide active layer distal to the base substrate; patterning the metal oxide active layer; removing the photoresist layer in the display area; and treating the metal oxide active layer in the display area with a plasma to increase an oxygen content of the metal oxide active layer in the display area.

When treating the metal oxide active layer with the plasma, the photoresist layer on the metal oxide active layer in the display area is removed. The metal oxide active layer in the display area is directly treated with the plasma. As a result, the oxygen content in the metal oxide active layer in the display area increases, and the carrier concentration in the metal oxide active layer in the display area decreases. Initial threshold voltages of the metal oxide thin film transistors in the display area are positively biased, negative bias voltage stress tolerance of the metal oxide thin film transistors in the display area is enhanced, but positive bias voltage stress tolerance of the metal oxide thin film transistors in the display area decreases. The metal oxide thin film transistors in the display area are typically in a negative bias voltage state, thus the decrease in positive bias voltage stress tolerance does not significantly affect the thin film transistor's performance. When treating the metal oxide active layer with the plasma, the photoresist layer on the metal oxide active layer in the peripheral area remains unremoved. The metal oxide active layer in the peripheral area are not treated with the plasma, and initial threshold voltages of the metal oxide active layer in the peripheral area do not change. As a result, the metal oxide thin film transistors in the peripheral area maintain their positive bias voltage stress tolerance. The reliability of the metal oxide thin film transistors in both the display area and the peripheral area can be ensured.

In some embodiments, the array substrate includes a display area and a peripheral area. The display area includes a plurality of subpixel, and the peripheral area includes a plurality of gate-on-array (GOA) units. Optionally, the plurality of subpixels and the plurality of GOA units includes thin film transistors of a same type. For example, the thin film transistors in the plurality of subpixels and the plurality of GOA units can be both of a back channel etched type thin film transistor. In another example, the thin film transistors in the plurality of subpixels and the plurality of GOA units are both of an etch stopper type thin film transistor.

Figure 2:
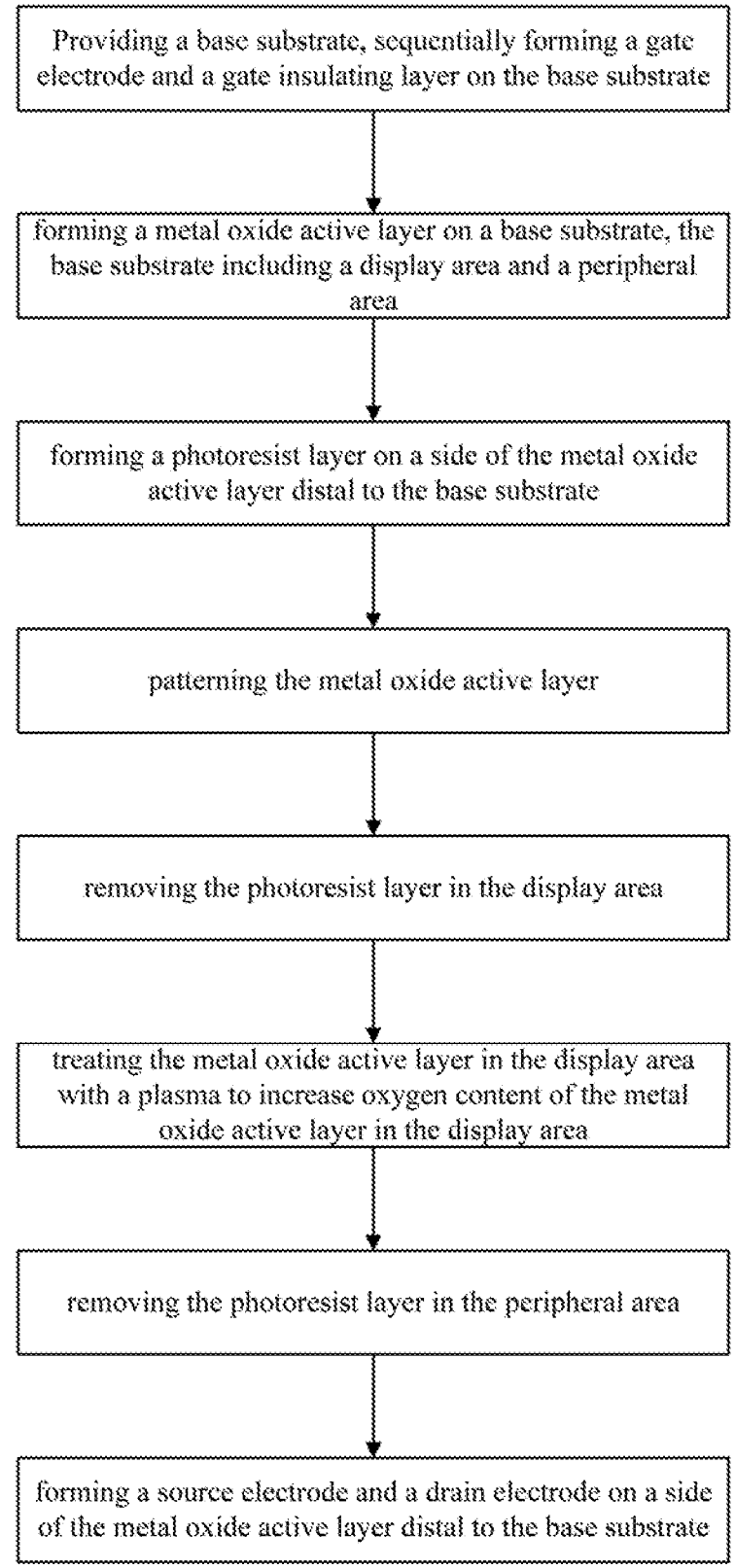
FIG. 2 is a flow chart illustrating a method of fabricating an array substrate in some embodiments according to the present disclosure.

In some embodiments, the plurality of first thin film transistors in the display area are bottom gate-type thin film transistors. Optionally, the plurality of first thin film transistors in the display area and the plurality of second thin film transistors in the peripheral area are bottom gate-type thin film transistors. In some embodiments, the active layers of the plurality of first thin film transistors in the display area are metal oxide active layers. Optionally, the active layers of the plurality of first thin film transistors in the display area and the plurality of second thin film transistors in the peripheral area are metal oxide active layers. FIG. 2 is a flow chart illustrating a method of fabricating an array substrate in some embodiments according to the present disclosure. Referring to FIG. 2, the method in some embodiments includes providing a base substrate, sequentially forming a gate electrode and a gate insulating layer on the base substrate; forming a metal oxide active layer on a base substrate, the base substrate including a display area and a peripheral area; forming a photoresist layer on a side of the metal oxide active layer distal to the base substrate; patterning the metal oxide active layer, removing the photoresist layer in the display area; treating the metal oxide active layer in the display area with a plasma to increase an oxygen content of the metal oxide active layer in the display area; removing the photoresist layer in the peripheral area; and forming a source electrode and a drain electrode on a side of the metal oxide active layer distal to the base substrate. By having a bottom gate-type thin film transistor, the gate electrode and the gate insulating layer can shield the active layer from light emitted from a back light. Thus, adverse effects of light on electrical properties of the thin film transistor can be minimized or reduced.

Various appropriate conductive materials and various appropriate fabricating methods may be used to make the gate electrode. For example, a conductive material may be deposited on the substrate (e.g., by sputtering or vapor deposition); and patterned (e.g., by lithography such as a wet etching process) to form the gate electrode. Examples of appropriate conductive materials for making the gate electrode include, but are not limited to, aluminum, tungsten, copper, and molybdenum, and alloys or laminates containing the same.

Various appropriate insulating materials and various appropriate fabricating methods may be used to make the gate insulating layer. For example, an insulating material may be deposited on the substrate by a plasma-enhanced chemical vapor deposition (PECVD) process. Examples of appropriate insulating materials include, but are not limited to, silicon oxide ($SiO_y$), silicon nitride ($SiN_y$, e.g., $Si_3N_4$), silicon oxynitride ($SiO_xN_y$), zirconium dioxide ($ZrO_2$), and titanium dioxide ($TiO_2$).

Various appropriate semiconductor materials and various appropriate fabricating methods may be used to make the active layer. For example, a semiconductor material may be deposited on the substrate by magnetron sputtering, vapor deposition (e.g., plasma-enhanced chemical vapor deposition), or vacuum deposition. In some embodiments, the active layer includes $M1O_aN_b$, wherein M1 is a single metal or a combination of metals, a>0, and b≥0, e.g., the active layer includes a metal oxide material or a metal oxynitride material. Examples of appropriate semiconductor materials include, but are not limited to, indium gallium zinc oxide, zinc oxide, and hafnium indium zinc oxide. Optionally, the active layer includes indium gallium zinc oxide.

Figure 3:
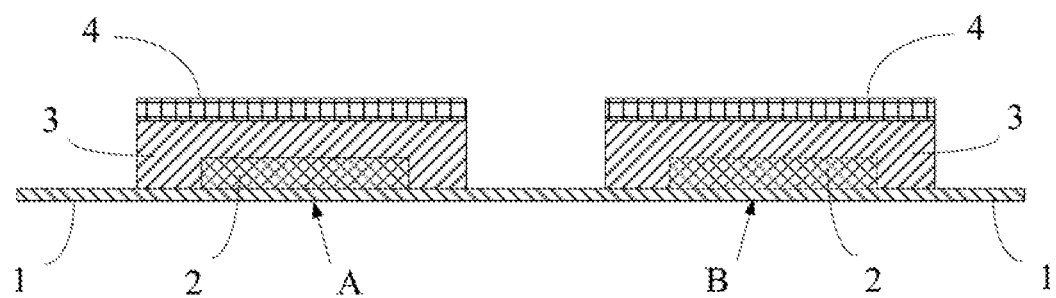
FIGS. 3 to 9 illustrate a process of fabricating an array substrate in some embodiments according to the present disclosure.

In some embodiments, the method includes forming a semiconductor material layer on a base substrate; patterning the semiconductor material layer to form a plurality of first semiconductor material blocks corresponding to the active layers of the plurality of first thin film transistors and a plurality of second semiconductor material blocks corresponding to the active layers of the plurality of second thin film transistors; and increasing an oxygen content in the plurality of first semiconductor material blocks. Optionally, patterning the semiconductor material layer to form the plurality of first semiconductor material blocks and the plurality of second semiconductor material blocks are performed in a single process. FIGS. 3 to 9 illustrate a process of fabricating an array substrate in some embodiments according to the present disclosure. Referring to FIG. 3, the method in some embodiments includes forming a gate electrode 2 on a base substrate 1; forming a gate insulating layer 3 on a side of the gate electrode 2 distal to the base substrate 1; and forming a semiconductor material layer 4 on a side of the gate insulating layer 3 distal to the gate electrode 2.

Figure 4:
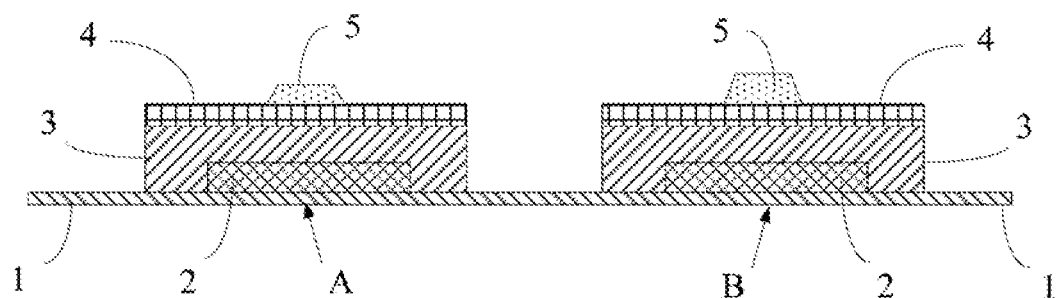

Referring to FIG. 4, the method in some embodiment further includes forming a first photoresist layer 5 on a side of the semiconductor material layer 4 distal to the base substrate 1. The first photoresist layer 5 is formed in a first region corresponding to the active layers of the plurality of first thin film transistors in the display area A and the active layers of the plurality of second thin film transistors in the peripheral area B.

Figure 5:
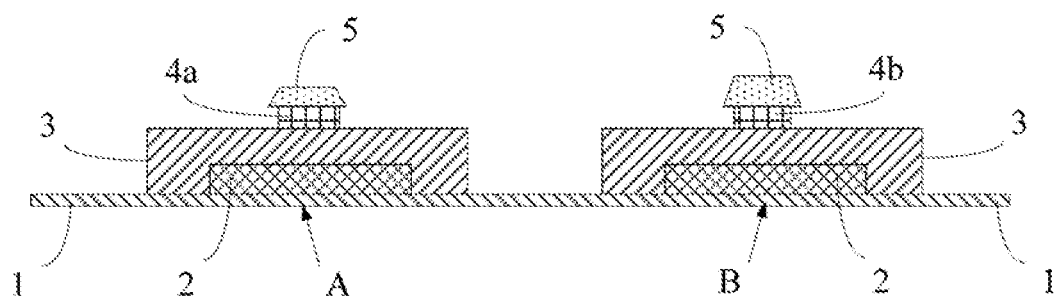

Referring to FIG. 5, the method in some embodiment further includes removing the semiconductor material layer 4 outside the first region, thereby forming the plurality of first semiconductor material blocks 4a in the display area A and the plurality of second semiconductor material blocks 4b in the peripheral area B.

Figure 6:
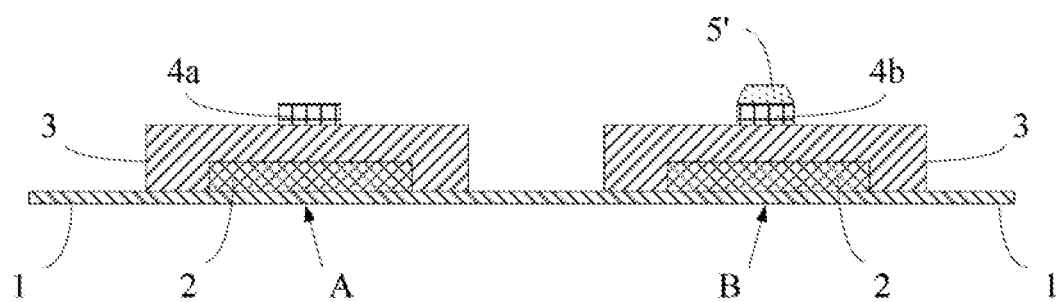

Referring to FIG. 6, the method in some embodiment further includes forming a second photoresist layer 5' by removing a portion of the first photoresist layer 5 to expose the plurality of first semiconductor material blocks 4a in the display area A. The second photoresist layer 5' is formed on a side of the plurality of second semiconductor material blocks 4b in the peripheral area B distal to the base substrate 1.

Figure 7:
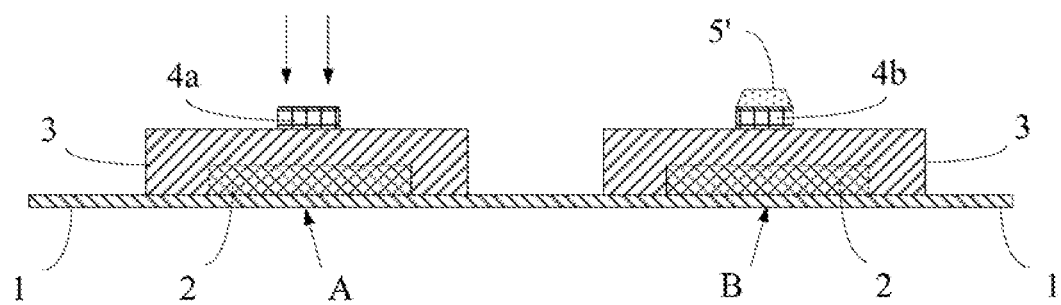

Referring to FIG. 7, the method in some embodiment further includes increasing an oxygen content in the plurality of first semiconductor material blocks 4a in the display area A. As shown in FIG. 7, the step of increasing the oxygen content in the plurality of first semiconductor material blocks 4a in some embodiments includes plasma bombarding the plurality of first semiconductor material blocks 4a with a plasma (e.g., an oxygen-containing plasma), thereby forming the active layers 4" of the plurality of first thin film transistors in the display area A.

Figure 8:
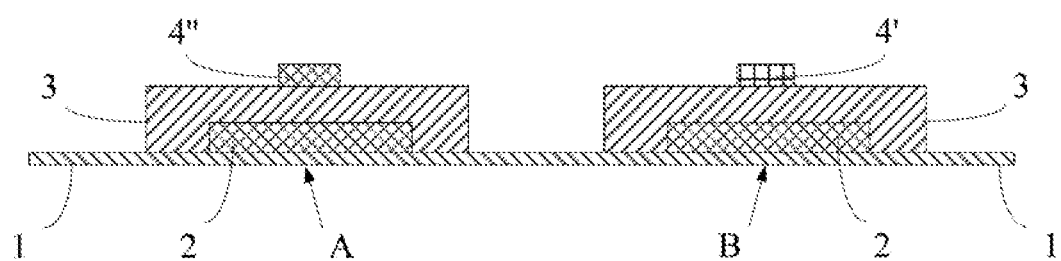

Referring to FIG. 8, subsequent to increasing the oxygen content in the plurality of first semiconductor material blocks 4a, the method in some embodiment further includes removing the second photoresist layer 5' thereby forming the active layers 4' of the plurality of second thin film transistors in the peripheral area B.

In some embodiments, the step of patterning the semiconductor material layer 4 includes forming a photoresist material layer on a side of the semiconductor material layer 4 distal to the base substrate 1; exposing the photoresist material layer with a mask plate, and developing an exposed photoresist material layer to obtain a photoresist pattern having a first section in a region corresponding to the active layers 4" of the plurality of first thin film transistors and the active layers 4' of the plurality of second thin film transistors, and a second section outside of the first region, the photoresist material being removed in the second section thereby forming a first photoresist layer 5 in the second section; and removing the semiconductor material layer 4 in a region corresponding to the second section, thereby forming the plurality of first semiconductor material blocks 4a in the display area A and the plurality of second semiconductor material blocks 4b in the peripheral area B.

Optionally, the mask plate is a half-tone mask plate or a gray-tone mask plate. Optionally, the first section includes a first zone and a second zone. The first zone corresponds to the active layers 4" of the plurality of first thin film transistors in the display area A. The second zone corresponds to the active layers 4' of the plurality of second thin film transistors in the peripheral area B. The second zone is substantially unexposed, the first zone is partially exposed, and the second section is fully exposed. The first photoresist layer 5 in the second zone has a thickness greater than that in the first zone (as shown in FIG. 5). Optionally, the method further includes ashing the first photoresist layer 5 to remove the first photoresist layer in the first zone thereby exposing the plurality of first semiconductor material blocks 4a in the display area A. Photoresist material in the second zone remains with a reduced thickness subsequent to ashing, thereby forming a second photoresist layer 5' (as shown in FIG. 6).

The gray-tone mask plate (or the half-tone mask plate) includes a light transmissive section, a semi-light-shielding section, and a light-shielding section. When a positive photoresist is used, the transmissive section corresponds to the second section, the semi-light-shielding section corresponds to the first zone, and the light-shielding section corresponds to the second zone. When a negative photoresist is used, the light-shielding section corresponds to the second section, the semi-light-shielding section corresponds to the first zone, and the transmissive section corresponds to the second zone.

In some embodiments, the step of removing the semiconductor material layer outside the first region is performed by etching. Optionally, a wet etchant such as an etching solution is used for removing the semiconductor material layer outside the first region. In one example, the etching solution is sprayed onto the substrate. The first photoresist layer 5 is formed in the first region corresponding to the active layers of the plurality of first thin film transistors and the active layers of the plurality of second thin film transistors. The etching solution sprayed on the substrate removes the semiconductor material in a region outside the first region, thereby forming the plurality of first semiconductor material blocks 4a in the display area A and the plurality of second semiconductor material blocks 4b in the peripheral area B.

In some embodiments, the step of plasma bombarding is performed at a power in a range of approximately 400 w to approximately 800 w for a duration in a range of approximately 40 seconds to approximately 60 seconds. Optionally, the power for plasma bombarding refers to a power for maintaining the plasma. Optionally, the duration for plasma bombarding refers to a duration during which the surfaces of the plurality of first semiconductor material blocks 4a are exposed to the plasma. By plasma bombarding the plurality of first semiconductor material blocks 4a, the oxygen content in the plurality of first semiconductor material blocks 4a increases, leading to a reduced carrier concentration and an enhanced negative bias voltage stress tolerance in the active layers 4" of the plurality of first thin film transistors in the display area A. Moreover, a reduced carrier concentration results in a lower leak current in the plurality of first thin film transistors in the display area A, achieving a higher reliability of the thin film transistors.

Optionally, the step of increasing the oxygen content in the plurality of first semiconductor material blocks 4a is performed using an oxygen-containing plasma. Examples of oxygen-containing plasmas include, but are not limited to, nitrous oxide and oxygen.

In some embodiments, prior to forming the active layers 4" of the plurality of first thin film transistors and the active layers 4' of the plurality of second thin film transistors, the method further includes forming a gate electrode 2 on a side of each of the active layers 4" of the plurality of first thin film transistors and the active layers 4' of the plurality of second thin film transistors proximal to the base substrate. In some embodiments, prior to forming the active layers 4" of the plurality of first thin film transistors and the active layers 4' of the plurality of second thin film transistors, the method further includes forming a gate electrode 2 on the base substrate 1, and forming a gate insulating layer 3 on a side of the gate electrode 2 distal to the base substrate 1, the gate insulating layer 3 is formed between the gate electrodes 2 and the active layers 4" of the plurality of first thin film transistors and the active layers 4' of the plurality of second thin film transistors.

In some embodiments, subsequent to forming the active layers 4" of the plurality of first thin film transistors and the active layers 4' of the plurality of second thin film transistors, the method further includes forming an etch stop layer on a side of the active layers 4" of the plurality of first thin film transistors and the active layers 4' of the plurality of second thin film transistors distal to the base substrate.

Figure 9:
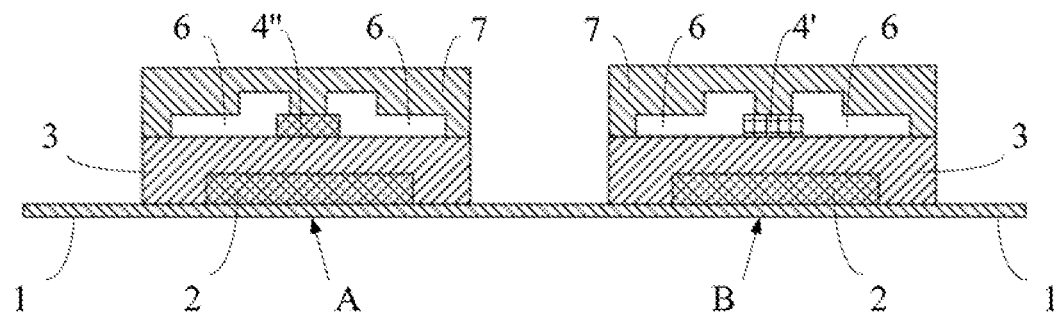

Referring to FIG. 9, subsequent to forming the active layers 4" of the plurality of first thin film transistors and the active layers 4' of the plurality of second thin film transistors, the method in some embodiments further includes forming a source electrode and a drain electrode 6 on a side of the active layers 4" of the plurality of first thin film transistors and the active layers 4' of the plurality of second thin film transistors distal to the base substrate 1, and forming a passivation layer 7 on a side of the source electrode and the drain electrode 6 distal to the base substrate 1.

When treating the metal oxide active layer with the plasma, the photoresist layer on the metal oxide active layer in the display area is removed. The metal oxide active layer in the display area is directly treated with the plasma. As a result, the oxygen content in the metal oxide active layer in the display area increases, and the carrier concentration in the metal oxide active layer in the display area decreases. Initial threshold voltages of the metal oxide thin film transistors in the display area are positively biased, negative bias voltage stress tolerance of the metal oxide thin film transistors in the display area is enhanced, but positive bias voltage stress tolerance of the metal oxide thin film transistors in the display area decreases. The metal oxide thin film transistors in the display area are typically in a negative bias voltage state, thus the decrease in positive bias voltage stress tolerance does not significantly affect the thin film transistor's performance. When treating the metal oxide active layer with the plasma, the photoresist layer on the metal oxide active layer in the peripheral area remains unremoved. The metal oxide active layer in the peripheral area are not treated with the plasma, and initial threshold voltages of the metal oxide active layer in the peripheral area do not change. As a result, the metal oxide thin film transistors in the peripheral area maintain their positive bias voltage stress tolerance. The reliability of the metal oxide thin film transistors in both the display area and the peripheral area can be ensured.

Figure 10:
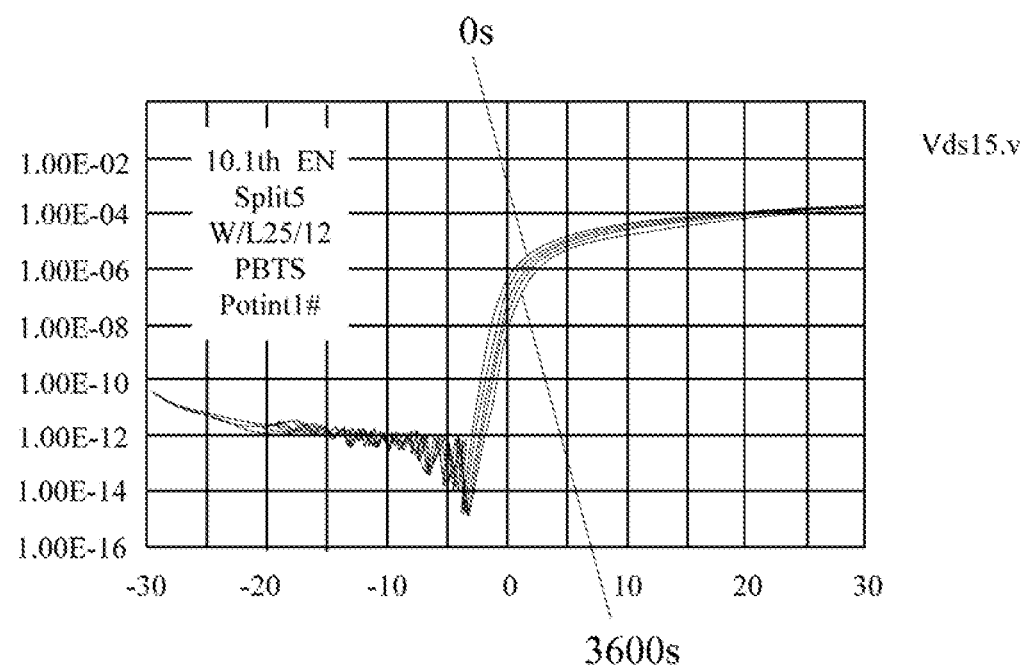
FIGS. 10 to 11 illustrate the correlation between a threshold voltage of a thin film transistor and bias voltage stress tolerance in some embodiments according to the present disclosure.
Figure 11:
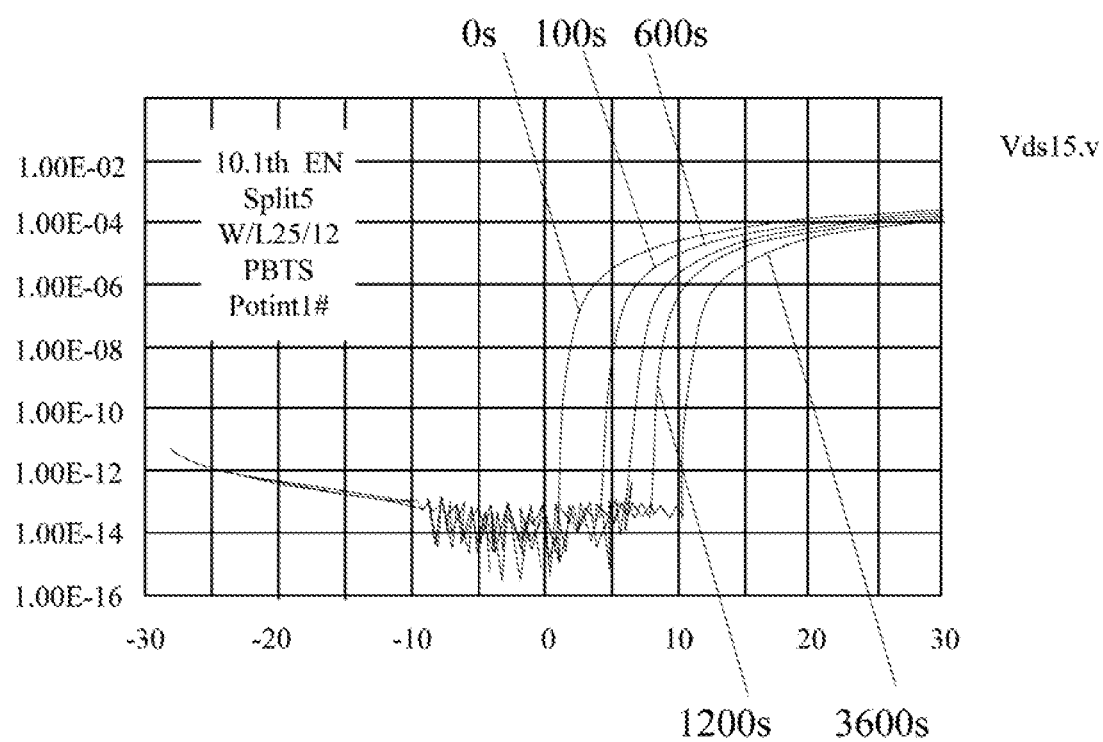

FIGS. 10 to 11 illustrate the correlation between a threshold voltage of a thin film transistor and bias voltage stress tolerance in some embodiments according to the present disclosure. Referring to FIG. 10, the metal oxide active layer thin film transistor in some embodiments has a negative initial threshold voltage. When a positive bias voltage is applied to the thin film transistor for a duration of 3600 seconds, the threshold voltage positive shift does not exceed 1 V. Referring to FIG. 11, the metal oxide active layer thin film transistor in some embodiments has a positive initial threshold voltage. When a same positive bias voltage is applied to the thin film transistor for a duration of 3600 seconds, the threshold voltage positive shift is approximately 10 V. Thus, when the initial threshold voltage shifts positively (e.g., becoming more positive or less negative), the positive bias voltage stress tolerance of the thin film transistor decreases.

In some embodiments, each gate-on-array unit may include a plurality of thin film transistors. Table 1 illustrates effects of threshold voltage shift on the properties of the thin film transistors in a gate-on-array unit in some embodiments according to the present disclosure. As shown in Table 1, the gate-on-array unit in some embodiments includes fourteen metal oxide thin film transistors, M1 to M14. In one example, when the negative threshold voltage in M1 exceeds −3 V, an "no output" defect occurs in M1. When the positive threshold voltage in M1 exceeds 8 V, an "no output" defect occurs in M1. In another example, when the negative threshold voltage in M14 exceeds −15 V, an "no output" defect occurs in M14. When the positive threshold voltage in ML exceeds 30 V, an "multiple output" defect occurs in M1.

TABLE 1

Effects of threshold voltage shift on the properties of the thin film transistors in a gate-on-array unit in some embodiments according to the present disclosure.

| | Vth margin | | | | |
|---|---|---|---|---|---|
| | Negative Vth shift | | Positive Vth shift | | channel |
| | Negative Vth (V) | Defects | Positive Vth (V) | Defects | region width (μm) * |
| M1 | <−3 | No output | >8 | No output | 50 |
| M2 | <0 | No output | >30 | Multiple output | 20 |

TABLE 1-continued

Effects of threshold voltage shift on the properties of the
thin film transistors in a gate-on-array unit in
some embodiments according to the present disclosure.

| | Vth margin | | | | |
|---|---|---|---|---|---|
| | Negative Vth shift | | Positive Vth shift | | channel |
| | Negative Vth (V) | Defects | Positive Vth (V) | Defects | region width (μm) * |
| M3 | <−4 | Multiple output | >8 | No output | 200 |
| M4 | <−10 | No output | >30 | Multiple output | 20 |
| M5 | <−13 | No output | >30 | Multiple output | 5 |
| M6 | <−20 | Multiple output | >30 | No output | 30 |
| M7 | <−20 | Multiple output | >30 | No output | 10 |
| M8 | <−1 | No output | >30 | Multiple output | 50 |
| M9 | <−20 | Multiple output | >30 | PD stress increase | 10 |
| M10 | <−20 | Multiple output | >30 | | 30 |
| M13 | <−15 | No output | >30 | Multiple output | 30 |
| M14 | <−15 | No output | >30 | Multiple Output | 10 |

* Channel region length for all thin film transistors is 12 μm.

Each thin film transistor in the gate-on-array unit may have different threshold voltage shift value that results in an occurrence of a defect. To improve reliability of the gate-on-array unit, the gate-on-array unit needs to have both good positive bias voltage stress tolerance and good negative bias voltage stress tolerance. Based on the above, if the active layers of the plurality of second thin film transistors in the gate-on-array units are also treated by the plasma, the positive bias voltage stress tolerance of the second thin film transistors will be adversely affects, which in turn may affect reliability of the gate-on-array units. Thus, in the present method, the active layers of the plurality of second thin film transistors of the gate-on-array units in the peripheral area are protected by the second photoresist layer and are not plasma-treated. As a result, the metal oxide thin film transistors in the gate-on-array units in the peripheral area maintain their positive bias voltage stress tolerance. The reliability of the gate-on-array units can be ensured.

In another aspect, the present disclosure provides an array substrate fabricated by a method described herein.

In another aspect, the present disclosure provides an array substrate having a display area and a peripheral area. In some embodiments, the array substrate includes a plurality of first thin film transistors respectively in a plurality of subpixels in the display area, and a plurality of second thin film transistors in the peripheral area; an oxygen content in active layers of the plurality of first thin film transistors is higher than that in active layers of the plurality of second thin film transistors. Optionally, initial threshold voltages of the plurality of first thin film transistors are more positive or less negative than initial threshold voltages of the plurality of second thin film transistors. Optionally, the active layers of the plurality of first thin film transistors and the active layers of the plurality of second thin film transistors include $M1O_aN_b$, wherein M1 is a single metal or a combination of metals, a>0, and b≥0. Optionally, the active layers of the plurality of first thin film transistors and the active layers of the plurality of second thin film transistors include indium gallium zinc oxide. Optionally, the plurality of first thin film transistors and the plurality of second thin film transistors are bottom gate-type thin film transistors; each of the plurality of first thin film transistors includes a gate electrode on a side of each of the active layers of the plurality of first thin film transistors proximal to the base substrate; and each of the plurality of second thin film transistors includes a gate electrode on a side of each of the active layers of the plurality of second thin film transistors proximal to the base substrate. Optionally, channel regions, source electrode contact regions, and drain electrode contact regions of the active layers of the plurality of first thin film transistors have substantially a same oxygen content. Optionally, channel regions, source electrode contact regions, and drain electrode contact regions of the active layers of the plurality of second thin film transistors have substantially a same oxygen content. Optionally, the plurality of second thin film transistors are in one or more gate-on-array circuits. Optionally, a ratio of the oxygen content in active layers of the plurality of first thin film transistors to that in active layers of the plurality of second thin film transistors is in a range of approximately 1.005 to approximately 1.2.

In the present array substrate, the active layers in the display area have a higher oxygen content. As a result, the carrier concentration in the active layer in the display area decreases. Initial threshold voltages of the thin film transistors in the display area are positively biased, negative bias voltage stress tolerance of the thin film transistors in the display area is enhanced, but positive bias voltage stress tolerance of the thin film transistors in the display area decreases. The thin film transistors in the display area are typically in a negative bias voltage state, thus the decrease in positive bias voltage stress tolerance does not significantly affect the thin film transistor's performance. In the present array substrate, the active layers in the peripheral area have a lower oxygen content, and initial threshold voltages of the active layer in the peripheral area remain unchanged. As a result, the thin film transistors in the peripheral area maintain their positive bias voltage stress tolerance. The reliability of the thin film transistors in both the display area and the peripheral area can be ensured.

In another aspect, the present disclosure provides a display panel having an array substrate described herein or fabricated by a method described herein.

In another aspect, the present disclosure provides a display apparatus having a display panel described herein. Examples of appropriate display apparatuses include, but are not limited to, an electronic paper, a mobile phone, a tablet computer, a television, a monitor, a notebook computer, a digital album, a GPS, etc.

In the present display apparatus, the active layers in the display area have a higher oxygen content. As a result, the carrier concentration in the active layer in the display area decreases. Initial threshold voltages of the thin film transistors in the display area are positively biased, negative bias voltage stress tolerance of the thin film transistors in the display area is enhanced, but positive bias voltage stress tolerance of the thin film transistors in the display area decreases. The thin film transistors in the display area are typically in a negative bias voltage state, thus the decrease in positive bias voltage stress tolerance does not significantly affect the thin film transistor's performance. In the present display apparatus, the active layers in the peripheral area have a lower oxygen content, and initial threshold voltages of the active layer in the peripheral area remain unchanged. As a result, the thin film transistors in the peripheral area maintain their positive bias voltage stress tolerance. The reliability of the thin film transistors in both the display area and the peripheral area can be ensured.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate having a display area and a peripheral area, comprising:
    a base substrate;
    a plurality of first thin film transistors on the base substrate and respectively in a plurality of subpixels in the display area; and
    a plurality of second thin film transistors on the base substrate and in the peripheral area;
    wherein an oxygen content in active layers of the plurality of first thin film transistors is higher than that in active layers of the plurality of second thin film transistors;
    a respective one of the plurality of first thin film transistors has a substantially uniform oxygen content across an entirety of a surface of an active layer of the respective one of the plurality of first thin film transistors away from the base substrate; and
    a respective one of the plurality of second thin film transistors has a substantially uniform oxygen content across an entirety of a surface of an active layer of the respective one of the plurality of second thin film transistors away from the base substrate.

2. The array substrate of claim 1, wherein initial threshold voltages of the plurality of first thin film transistors are more positive or less negative than initial threshold voltages of the plurality of second thin film transistors.

3. The array substrate of claim 1, wherein the active layers of the plurality of first thin film transistors and the active layers of the plurality of second thin film transistors comprise $M1O_aN_b$, wherein M1 is a single metal or a combination of metals, a >0, and b ≥0.

4. The array substrate of claim 3, wherein the active layers of the plurality of first thin film transistors and the active layers of the plurality of second thin film transistors comprise indium gallium zinc oxide.

5. The array substrate of claim 3, wherein the plurality of first thin film transistors and the plurality of second thin film transistors are bottom gate-type thin film transistors.

6. The array substrate of claim 1, wherein the plurality of second thin film transistors are in one or more gate-on-array circuits.

7. The array substrate of claim 1, wherein a ratio of the oxygen content in active layers of the plurality of first thin film transistors to that in active layers of the plurality of second thin film transistors is in a range of approximately 1.005 to approximately 1.2.

8. A method of fabricating an array substrate having a display area and a peripheral area, comprising:
    forming a plurality of first thin film transistors respectively in a plurality of subpixels in the display area and a plurality of second thin film transistors in the peripheral area;
    wherein the plurality of first thin film transistors are formed to have a higher oxygen content in active layers of the plurality of first thin film transistors than that in active layers of the plurality of second thin film transistors;
    substantially an entirety of an active layer of a respective one of the plurality of first thin film transistors is formed to has a substantially uniform oxygen content; and
    substantially an entirety of an active layer of a respective one of the plurality of second thin film transistors is formed to has a substantially uniform oxygen content.

9. The method of claim 8, comprising:
    forming a semiconductor material layer on a base substrate;
    patterning the semiconductor material layer to form a plurality of first semiconductor material blocks corresponding to the active layers of the plurality of first thin film transistors and a plurality of second semiconductor material blocks corresponding to the active layers of the plurality of second thin film transistors; and
    increasing an oxygen content in the plurality of first semiconductor material blocks.

10. The method of claim 9, wherein increasing the oxygen content in the plurality of first semiconductor material blocks is performed by plasma bombarding the plurality of first semiconductor material blocks with a plasma comprising oxygen.

11. The method of claim 10, wherein the plasma comprising oxygen comprises nitrous oxide or oxygen.

12. The method of claim 10, wherein the plasma bombarding is performed at a power in a range of approximately 400 w to approximately 800 w for a duration in a range of approximately 40 seconds to approximately 60 seconds.

13. The method of claim 9, wherein patterning the semiconductor material layer to form the plurality of first semiconductor material blocks and the plurality of second semiconductor material blocks are performed in a single process.

14. The method of claim 13, wherein patterning the semiconductor material layer comprises:
    forming a first photoresist layer on a side of the semiconductor material layer distal to the base substrate; the first photoresist layer being in a first region corresponding to the active layers of the plurality of first thin film transistors and the active layers of the plurality of second thin film transistors;

removing the semiconductor material layer outside the first region, thereby forming the plurality of first semiconductor material blocks and the plurality of second semiconductor material blocks;

forming a second photoresist layer by removing a portion of the first photoresist layer to expose the plurality of first semiconductor material blocks, the second photoresist layer being on a side of the plurality of second semiconductor material blocks distal to the base substrate;

wherein increasing the oxygen content in the plurality of first semiconductor material blocks comprises plasma bombarding the plurality of first semiconductor material blocks with a plasma comprising oxygen, thereby forming the active layers of the plurality of first thin film transistors; and subsequent to increasing the oxygen content in the plurality of first semiconductor material blocks, the method further comprising removing the second photoresist layer thereby forming the active layers of the plurality of second thin film transistors.

15. The method of claim 13, wherein patterning the semiconductor material layer comprises:

forming a photoresist material layer on a side of the semiconductor material layer distal to the base substrate;

exposing the photoresist material layer with a mask plate, and developing an exposed photoresist material layer to obtain a photoresist pattern having a first section in a region corresponding to the active layers of the plurality of first thin film transistors and the active layers of the plurality of second thin film transistors, and a second section outside of the first region, the photoresist material being removed in the second section thereby forming a first photoresist layer in the second section; and removing the semiconductor material layer in a region corresponding to the second section, thereby forming the plurality of first semiconductor material blocks and the plurality of second semiconductor material blocks.

16. The method of claim 15, wherein the mask plate is a half-tone mask plate or a gray-tone mask plate, the first section comprises a first zone and a second zone;

the first zone corresponding to the active layers of the plurality of first thin film transistors;

the second zone corresponding to the active layers of the plurality of second thin film transistors;

the second zone is substantially unexposed, the first zone is partially exposed, and the second section is fully exposed; and the first photoresist layer in the second zone has a thickness greater than that in the first zone;

the method further comprising:

ashing the first photoresist layer to remove the first photoresist layer in the first zone thereby exposing the plurality of first semiconductor material blocks;

wherein photoresist material in the second zone remains with a reduced thickness subsequent to ashing, thereby forming a second photoresist layer.

17. The method of claim 8, wherein the active layers of the plurality of first thin film transistors and the active layers of the plurality of second thin film transistors comprise $M1O_aN_b$, wherein M1 is a single metal or a combination of metals, a >0, and b ≥0.

18. An array substrate fabricated by a method of claim 8.

19. A display apparatus, comprising the array substrate of claim 18.

* * * * *